US008164267B2

(12) United States Patent
Matsueda et al.

(10) Patent No.: US 8,164,267 B2
(45) Date of Patent: Apr. 24, 2012

(54) ELECTRO-OPTICAL DEVICE, MATRIX SUBSTRATE, AND ELECTRONIC APPARATUS

(75) Inventors: Yojiro Matsueda, Chino (JP); Hayato Nakanishi, Toyama (JP)

(73) Assignee: Seiko Epson Corporation, Tokyo (JP)

( * ) Notice: Subject to any disclaimer, the term of this patent is extended or adjusted under 35 U.S.C. 154(b) by 376 days.

(21) Appl. No.: 12/219,592

(22) Filed: Jul. 24, 2008

(65) Prior Publication Data

US 2008/0290807 A1 Nov. 27, 2008

Related U.S. Application Data

(63) Continuation of application No. 10/676,067, filed on Oct. 2, 2003, now abandoned.

(30) Foreign Application Priority Data

Oct. 7, 2002 (JP) .................................. 2002-293696

(51) Int. Cl.
*H01J 1/62* (2006.01)
(52) U.S. Cl. .......... 315/169.3; 257/72; 257/99; 313/506
(58) Field of Classification Search .................. 315/160, 315/161, 167, 169.2, 169.3; 313/483, 505, 313/506, 306; 257/40, 72, 98, 99
See application file for complete search history.

(56) References Cited

U.S. PATENT DOCUMENTS

| 5,159,476 | A | 10/1992 | Hayashi | |
|---|---|---|---|---|
| 6,175,345 | B1 * | 1/2001 | Kuribayashi et al. | ........... 345/76 |
| 6,522,079 | B1 * | 2/2003 | Yamada | ..................... 315/169.3 |
| 6,545,424 | B2 * | 4/2003 | Ozawa | ........................ 315/169.3 |
| 6,633,135 | B2 | 10/2003 | Nara et al. | |
| 6,633,270 | B2 * | 10/2003 | Hashimoto | ..................... 345/76 |
| 6,724,149 | B2 | 4/2004 | Komiya et al. | |
| 6,825,820 | B2 | 11/2004 | Yamazaki et al. | |
| 6,858,991 | B2 * | 2/2005 | Miyazawa | ................. 315/169.3 |
| 6,885,356 | B2 * | 4/2005 | Hashimoto | ..................... 345/77 |
| 6,965,363 | B2 | 11/2005 | Sato et al. | |
| 7,009,345 | B2 | 3/2006 | Komiya et al. | |
| 7,760,162 | B2 * | 7/2010 | Miyazawa | ..................... 345/76 |

(Continued)

FOREIGN PATENT DOCUMENTS

JP    A-2000-242196    9/2000

(Continued)

OTHER PUBLICATIONS

Japanese Office Action dated Sep. 6, 2011 for Japanese Application No. 2008-212529 (with translation).

*Primary Examiner* — Thuy Vinh Tran
(74) *Attorney, Agent, or Firm* — Oliff & Berridge, PLC

(57) ABSTRACT

To provide a wiring layout of electric power lines, which improves the aperture ratio of the pixel while forming pixels with the same pixel pitch. An electric-optical apparatus according to the present invention comprises multiple pixels (10) arranged in matrix including electro-optical devices driven by receiving electric power from an electric power supply circuit, wherein the aforementioned multiple pixels (10) make up multiple pixel groups formed of a series of pixels arrayed in at least one direction of the row direction and the column direction, and any of line forming regions (31, 32, 33, 34) is disposed between adjacent pixel groups of the aforementioned pixel groups, wherein the aforementioned line forming regions (31, 32, 33, 34) are formed with generally the same width.

7 Claims, 7 Drawing Sheets

U.S. PATENT DOCUMENTS

| | | |
|---|---|---|
| 2001/0048106 A1 | 12/2001 | Tanada |
| 2002/0140644 A1 | 10/2002 | Sato et al. |
| 2002/0158573 A1* | 10/2002 | Kobashi .................. 313/498 |
| 2003/0076046 A1 | 4/2003 | Komiya et al. |
| 2006/0055643 A1 | 3/2006 | Sato et al. |

FOREIGN PATENT DOCUMENTS

| | | |
|---|---|---|
| JP | A-2001-100654 | 4/2001 |
| JP | A-2001-272930 | 10/2001 |
| JP | A-2002-151276 | 5/2002 |
| JP | A-2002-287663 | 10/2002 |

* cited by examiner

ELECTRO-OPTICAL DEVICE, MATRIX SUBSTRATE, AND ELECTRONIC APPARATUS

This is a Continuation of application Ser. No. 10/676,067 filed Oct. 2, 2003 which was abandoned. The disclosure of the prior application is hereby incorporated by reference herein in its entirety.

BACKGROUND OF THE INVENTION

1. Field of Invention

The present invention relates to a wiring layout suitable for an electro-optical device including electro-optical devices.

2. Description of Related Art

Organic EL devices are current-driven self-light-emitting devices, and accordingly, there are an advantage of no need to provide a backlight, as well as other advantages such as low power consumption, a wide range of vision, and a high contrast ratio, so there is high expectation for development of flat panel displays employing EL devices. The organic EL device is an electro-optical device including a light-emission layer introduced between an anode and a cathode, wherein, upon supplying forward bias current between both the electrodes, self-light-emission is effected due to the recombination energy at the time of recombination of a hole injected from the anode and an electron injected from the cathode. Accordingly, a supply of electric power from an external circuit is required in order to cause the organic EL device to emit light.

With conventional color-display active-matrix-driven display panels, an M number each of electric power lines and data lines are disposed in the column direction on a pixel matrix with an N number of columns and an M number of rows formed on a pixel region, as well as an N number of selection lines being disposed in the row direction on the aforementioned matrix. With a given pixel of such a wiring layout, a data line is disposed between the given pixel and the left-adjacent pixel, and an electric power line is disposed between the given pixel and the right-adjacent pixel. That is to say, with the lines disposed between adjacent pixels in the column direction, a layout is formed so that one data line and one electric line make up one pair. With the above-described configuration, disposed at an intersection of a scan line and a data line are: a switching transistor, a holding capacitance, a driving transistor, and an organic EL device for emitting light in one color of the RGB three primary colors, and these devices make up a pixel.

SUMMARY OF THE INVENTION

With the conventional arrangements, a light-emission layer is formed of a material corresponding to each color of the RGB three primary colors, and accordingly, the organic EL device is operated with greatly different power consumption corresponding to each color, so the optimal width of the electric power line is greatly different for each color. Accordingly, with the above-described wiring layout, while there is the need to determine the pixel pitch according to the maximal width for disposing the electric power lines, there is the need to form a pixel matrix with the same pixel pitch due to the restriction from the manufacturing process for a display, and accordingly, there is the need to determine the pixel layout at the sacrifice of the aperture ratio. On the other hand, in the event of reducing the aperture ratio, there is the need to increase the amount of electric current supplied to the organic EL device for obtaining predetermined luminance, and accordingly, there is the need to form the electric power line with a greater width, leading to further reduction of the aperture ratio from the above-described reason.

As described above, with the conventional wiring layout, the width of the electric line and the aperture ratio of the pixel are in the relation of trade off each other, and it is difficult to maintain a large aperture ratio while maintaining the electric power line with a suitable width for each color under the condition that the pixel matrix is formed with the same pixel pitch.

Accordingly, it is an object of the present invention to provide a wiring method for electric power lines, wherein the aperture ratio of the pixel can be increased while maintaining a pixel matrix with the same pixel pitch.

In order to solve the above-described problems, an electro-optical device according to the present invention comprises multiple pixels, disposed in the form of a matrix, including electro-optical devices driven by receiving electric power from an electric power supply circuit, wherein the multiple pixels make up multiple pixel groups formed of a series of pixels arrayed in at least one direction of the row direction and the column direction, and wherein line forming regions are formed between adjacent pixel groups of the multiple pixel groups, and wherein the line forming regions are formed with generally the same width. With such a configuration, the pixel pitch can be made the same.

Here, "electro-optical device" means a general electronic device for changing the optical state of light by using electric effects, and include, besides self-light-emitting devices such as electro-luminescence devices, electronic devices for displaying grayscale by adjusting the state of the polarized light, similarly to liquid crystal devices. With the present invention, the electro-luminescence devices are preferably employed. With the present invention, the electro-luminescence devices are employed, whereby current-driven self-light-emission devices can be obtained.

Another electro-optical device according to the present invention comprises multiple scan lines, multiple data lines, multiple pixels, disposed at portions corresponding to the intersections of the scan lines and the data lines, including electro-optical devices, and multiple electric power lines for supplying driving voltage to the electro-optical devices, wherein the multiple pixels make up multiple pixel groups formed of a series of pixels arrayed in at least one direction of the row direction and the column direction, and wherein multiple line forming regions are formed between adjacent pixel groups of the multiple pixel groups, and wherein at least two lines selected from at least one electric power line of the multiple electric power lines, at least one scan line of the multiple scan lines, and at least one data line of the multiple data lines, are formed in at least one line forming region of the multiple line forming regions. With such a configuration, a pixel matrix can be formed with the same pixel pitch, and also with a high aperture ratio while forming electric power lines with the optimal width.

Another electro-optical device according to the present invention comprises multiple scan lines, multiple data lines, multiple pixels, disposed at portions corresponding to the intersections of the scan lines and the data lines, including electro-optical devices, and multiple electric power lines for supplying driving voltage to the electro-optical devices, wherein the multiple pixels make up multiple pixel groups formed of a series of pixels arrayed in at least one direction of the row direction and the column direction, and wherein multiple line forming regions are formed between adjacent pixel groups of the multiple pixel groups, and wherein both at least one electric power line of the multiple electric power lines and at least one scan line of the multiple scan lines are formed in at least one line forming region of the multiple line forming regions. With such a configuration, a pixel matrix can be formed with the same pixel pitch, and also with a high aperture ratio while forming electric power lines with the optimal width.

Another electro-optical device according to the present invention comprises multiple scan lines, multiple data lines, multiple pixels, disposed at portions corresponding to the intersections of the scan lines and the data lines, including electro-optical devices, and multiple electric power lines for supplying driving voltage to the electro-optical devices, wherein the multiple pixels make up multiple pixel groups formed of a series of pixels arrayed in at least one direction of the row direction and the column direction, and wherein multiple line forming regions are formed between adjacent pixel groups of the multiple pixel groups, and wherein both at least one electric power line of the multiple electric power lines and at least one data line of the multiple data lines are formed in at least one line forming region of the multiple line forming regions. With such a configuration, a pixel matrix can be formed with the same pixel pitch, and also with a high aperture ratio while forming electric power lines with the optimal width.

The aforementioned line forming regions are preferably formed with generally the same width. With the present invention, the line forming regions are formed with generally the same width, whereby the pixel matrix can be formed with the same pixel pitch.

The aforementioned electro-optical device preferably includes electro-optical devices which are operated with different driving voltages, wherein the electric power lines for supplying voltage to the electro-optical devices are formed with different widths corresponding to the driving voltage. Even with such a configuration wherein the electric power lines are formed with different widths, the wiring layout is designed as described above, whereby the pixel matrix can be formed with the same pixel pitch while improving the aperture ratio.

The aforementioned electro-optical device preferably is a light-emission device, wherein the electric power lines are formed with each different width corresponding to the emission light color of the light-emission device. With the present invention, the optimal width of the electric power line is determined corresponding to the properties of the electro-optical device, thereby facilitating design of devices.

The color of the light which is to be emitted is preferably red, green, or blue. This enables full-color display.

The electro-optical device preferably is an electro-luminescence device. With the electro-luminescence device, the grayscale due to light emission can be controlled by current control.

An electronic apparatus according to the present invention comprises an electro-optical device according to the present invention. The electronic apparatus is not particularly restricted so long as it includes a display device, and can be applied to, for example, cellular phones, video cameras, personal computers, head mount displays, projectors, facsimiles, digital cameras, portable TVs, DSP devices, PDAs, palmtops, and the like.

A matrix substrate according to the present invention comprises multiple pixel electrodes disposed in the form of a matrix, wherein the multiple pixel electrodes make up multiple pixel electrode groups formed of a series of pixel electrodes arrayed in at least one direction of the row direction and the column direction, and wherein multiple line forming regions are formed between adjacent pixel electrode groups of the multiple pixel electrode groups, and wherein the line forming regions are formed with generally the same width. With such a configuration, the pixel pitch can be made the same.

Another matrix substrate according to the present invention comprises multiple scan lines, multiple data lines, multiple pixel electrodes disposed at portions corresponding to the intersections of the scan lines and the data lines, and multiple electric power lines for supplying voltage to the multiple pixel electrodes, wherein the multiple pixel electrodes make up multiple pixel electrode groups formed of a series of pixel electrodes arrayed in at least one direction of the row direction and the column direction, and wherein multiple line forming regions are formed between adjacent pixel electrode groups of the multiple pixel electrode groups, and wherein at least two lines selected from at least one electric power line of the multiple electric power lines, at least one scan line of the multiple scan lines, and at least one data line of the multiple data lines, are formed in at least one line forming region of the multiple line forming regions. With such a configuration, the pixel matrix can be formed with the same pixel pitch, and also with a high aperture ratio, while forming the electric power lines with the optimal width.

DETAILED DESCRIPTION OF PREFERRED EMBODIMENTS

The present embodiment will now be described with reference to the drawings.

Figure 1:
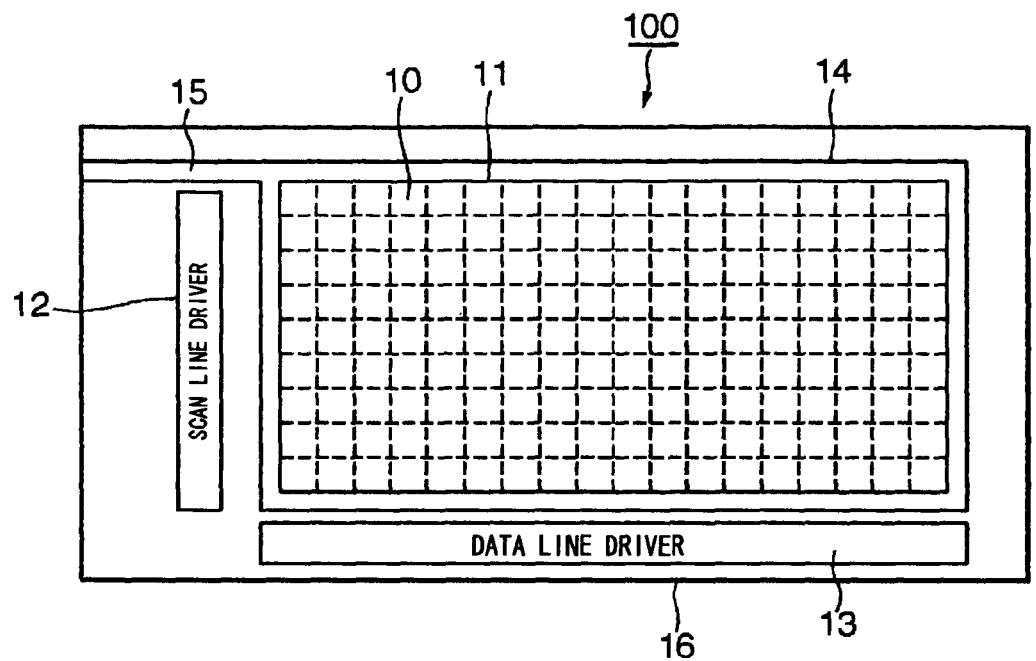
FIG. 1 is a plan view of an organic EL display panel according to the present invention.

FIG. 1 is an overall configuration diagram which illustrates an active-matrix organic-EL display panel 100 according to the present embodiment. As shown in the drawing, the display panel 100 comprises a display region 11 including multiple pixels 10 disposed in the form of a matrix with an N number of columns and an M number of rows, a scan line driver 12 for outputting scan signals to scan lines arrayed in the row direction which are connected to a group of pixels 10, a data line driver 13 for supplying data signals and electric power to data lines and electric power lines arrayed in the column direction which are connected to a group of pixels 10, wherein these components are disposed on a substrate 16. An organic EL device is formed on each pixel 10 for emitting light in a color of the RGB three primary colors. A cathode 14 is formed in the form of a film as a common electrode on the entire face of the display region 11, and is connected to an external circuit through cathode output electrode 15.

Note that while the organic EL display panel 100 shown in the drawing is a so-called "top-emission configuration display panel" which emits light from the side of the substrate 16, the present invention is not restricted to this arrangement, but rather, the present invention can also be applied to a bottom-emission configuration display panel which emits light from a transparent cathode.

Figure 2:
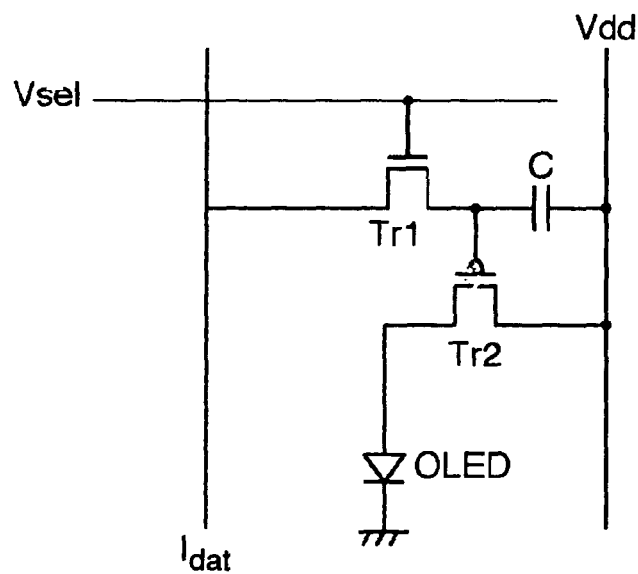
FIG. 2 is a principal circuit configuration diagram of a pixel.

FIG. 2 is a principal circuit configuration diagram of the pixel 10. The pixel 10 comprises a switching transistor Tr1, a driving transistor Tr2, holding capacitance C, a light-emission portion OLED, and is driven with the dual transistor method. The switching transistor Tr1 comprises an n-channel FET, wherein the gate terminal thereof is connected to the scan line $V_{sel}$, and the drain terminal thereof is connected to the data line $I_{dat}$. The driving transistor Tr2 comprises a p-channel FET, wherein the gate terminal is connected to the source terminal of the switching transistor Tr1. Furthermore, the source terminal of the transistor Tr2 is connected to the electric power line $V_{dd}$, and the drain terminal thereof is connected to the light-emission portion OLED. Furthermore, holding capacitance is formed between the gate and the source of the transistor Tr2. With the above-described configuration, upon outputting a selection signal to the scan line $V_{sel}$, and opening the transistor Tr1, the data signals supplied through the data line $I_{dat}$ are written to the holding capacitance C as a voltage value. Subsequently, the holding voltage written to the holding capacitance C is held during one frame period, and the conductance of the driving transistor Tr2 is determined according to the holding voltage in an analog manner, whereby forward bias current corresponding to light-emission level is supplied to the light-emission portion OLED.

Figure 3:
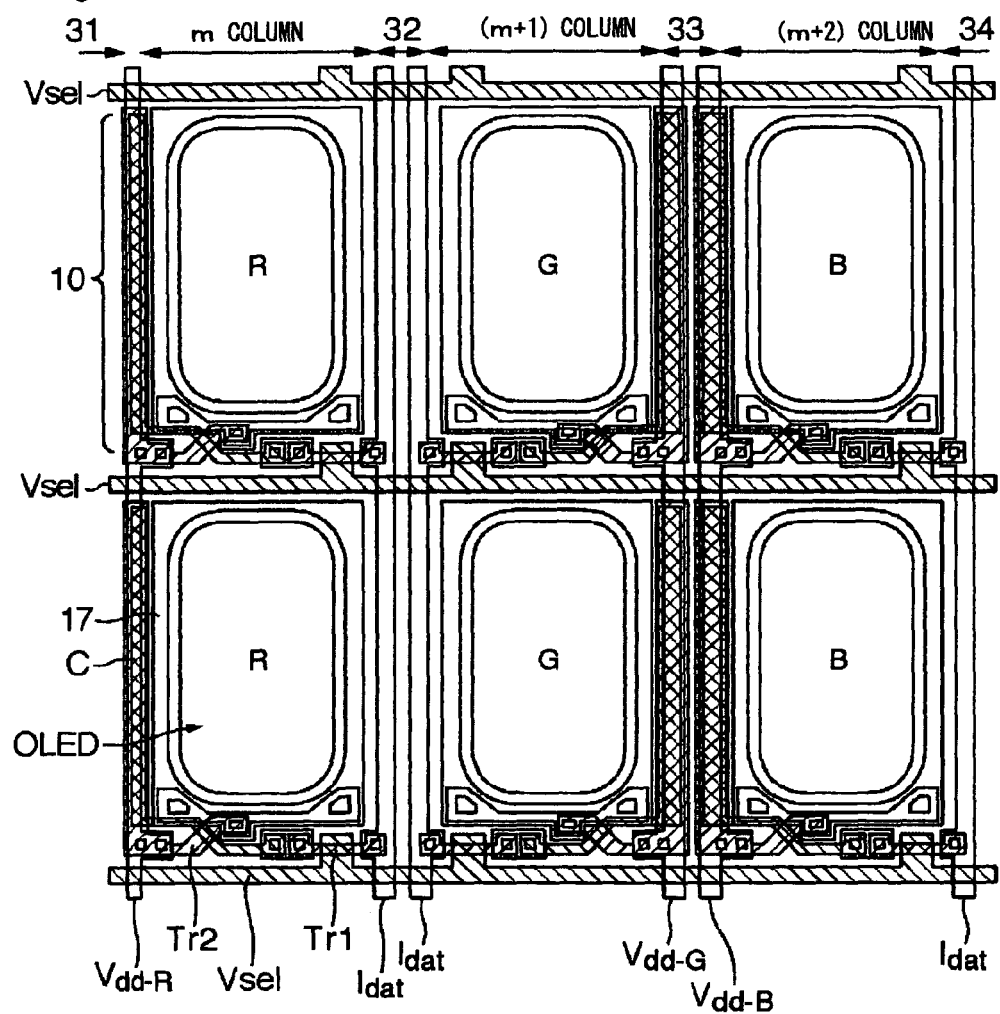
FIG. 3 is an explanatory diagram for describing a wiring layout according to a first embodiment.

FIG. 3 is a diagram for describing a wiring layout in the pixel region. In the drawing, in order to simplify description, a wiring layout for six pixels disposed with the two rows and the three columns is shown. In the drawing, reference characters R, G, and B denote the pixels 10 for emitting light in red, green, and blue, respectively, and the RGB pixels are disposed in the column direction. Furthermore, reference character $V_{dd-R}$ denotes an electric line for a red pixel, $V_{dd-G}$ denotes an electric line for a green pixel, $V_{dd-B}$ denotes an electric line for a blue pixel, and 17 denotes a pixel electrode (anode) of an organic EL device. Detailed description regarding other components described above will be omitted. Furthermore, reference numeral 31 denotes a line forming region in the form of a line which is formed between a pixel group of the (m−1) column and a pixel group of the m column, and is extending in the column direction over generally the same length as the pixel array length in the column direction. In the same way, reference numeral 32 denotes a line forming region formed between pixel groups of the m column and the (m+1) column, 33 denotes a line forming region formed between pixel groups of the (m+1) column and (m+2) column, and 34 denotes a line forming region formed between pixel groups of the (m+2) column and the (m+3) column. For convenience of description, a pixel group of the (m−1) column and a pixel group of the (m+3) column are not shown in the drawing. With the present embodiment, in order to determine the line forming regions 31 through 34 with the width as same as possible, two or more lines, disposed on the aforementioned line forming regions, are determined with the same total width. While the electric power line $V_{dd}$ is formed with a width corresponding to a material of the emission layer of the organic EL device, now, for convenience of description, let us make an assumption that the width of the electric power lines increases in the order of green, red, and blue. That is to say, let us assume that the relation: width of $V_{dd-G}$>width of $V_{dd-R}$>width of $V_{dd-B}$, holds.

With the above-described assumption, in order to form the line forming regions 31 through 34 with the width as same as possible, a combination is determined such that the total width of the electric power line $V_{dd}$ and the data line $I_{dd}$ is approximately the same. For example, making an assumption that: the total width of $V_{dd-G}$ which has the maximal width and $V_{dd-B}$ of the minimal width; the total width of $V_{dd-R}$ of an intermediate width and the data line $I_{dat}$ of an intermediate width; and the total width of the two data lines $I_{dat}$; are determined to be generally the same value, the combinations of these electric power lines $V_{dd}$ and the data line $I_{dat}$ are formed in the line forming regions 31 through 34. With the arrangement shown in the drawing, a combination of $V_{dd-G}$ with the maximal width and $V_{dd-B}$ with the minimal width is formed on the line forming region 33, a combination of $V_{dd-R}$ with the intermediate width and the data line $I_{dat}$ with the intermediate width is formed in the line forming regions 31 and 34, and a combination of the two data lines $I_{dat}$ is formed on the line forming region 32. Note that with the line forming region 31, only the electric power line $V_{dd-R}$ is shown in the drawing, and with the line forming region 34, only the data line $I_{dat}$ is shown in the drawing. On the other hand, a scan line $V_{sel}$ is disposed on each line forming region in the form of a line, between pixel groups arrayed in the row direction, with generally the same length as the pixel array length of the pixel group. The wiring layout shown in the drawing corresponds to one unit of a periodically repeating wiring pattern, and any portion of the wiring layout of the RGB pixels 10 randomly selected has the same pattern as shown in the drawing. Accordingly, in the event that an imaginary layout-diagram sheet, determining the layout of the line forming regions formed along the column direction of the pixels, is folded with any line forming region of the multiple line forming regions as the center line, the line forming regions having the same configuration of the lines are overlaid on each other.

With the present embodiment, the same kind of electric power line, extending in the column direction of the pixel matrix, is formed with generally the same array pitch in the row direction, and accordingly, the pixels can be formed with the same pixel pitch, thereby facilitating design of a layout for a device, wherein power consumption is different for each color, such as an organic EL display. In particular, in the event of forming light-emission layers using the ink-jet method, the pixels are preferably formed with the same pixel pitch, and accordingly, an arrangement according to the present embodiment has the great advantage of facilitating the manufacturing process. Furthermore, with the present embodiment, the electric power line can be formed with a width suitable for each color, thereby reducing power consumption while maintaining the high aperture ratio and the optimal color balance.

Note that the above-described arrangement is only an example of the present invention, and the present invention is not restricted to the above-described arrangement. For example, three combinations of two electric power lines selected from the three RGB lines $V_{dd}$ can be made, and accordingly, with the present embodiment, three wiring layout patterns can be made. Furthermore, while description has been made regarding a configuration wherein a scan line $V_{sel}$ is disposed on each line forming region in the row direction, and any two lines selected from the three electric power lines $V_{dd}$ and the three data line $I_{dat}$ are disposed on the line forming regions 31, 32, and 33 in the column direction, the present invention is not restricted to this arrangement. Description will be made below regarding various modifications.

Second Embodiment

Figure 4:
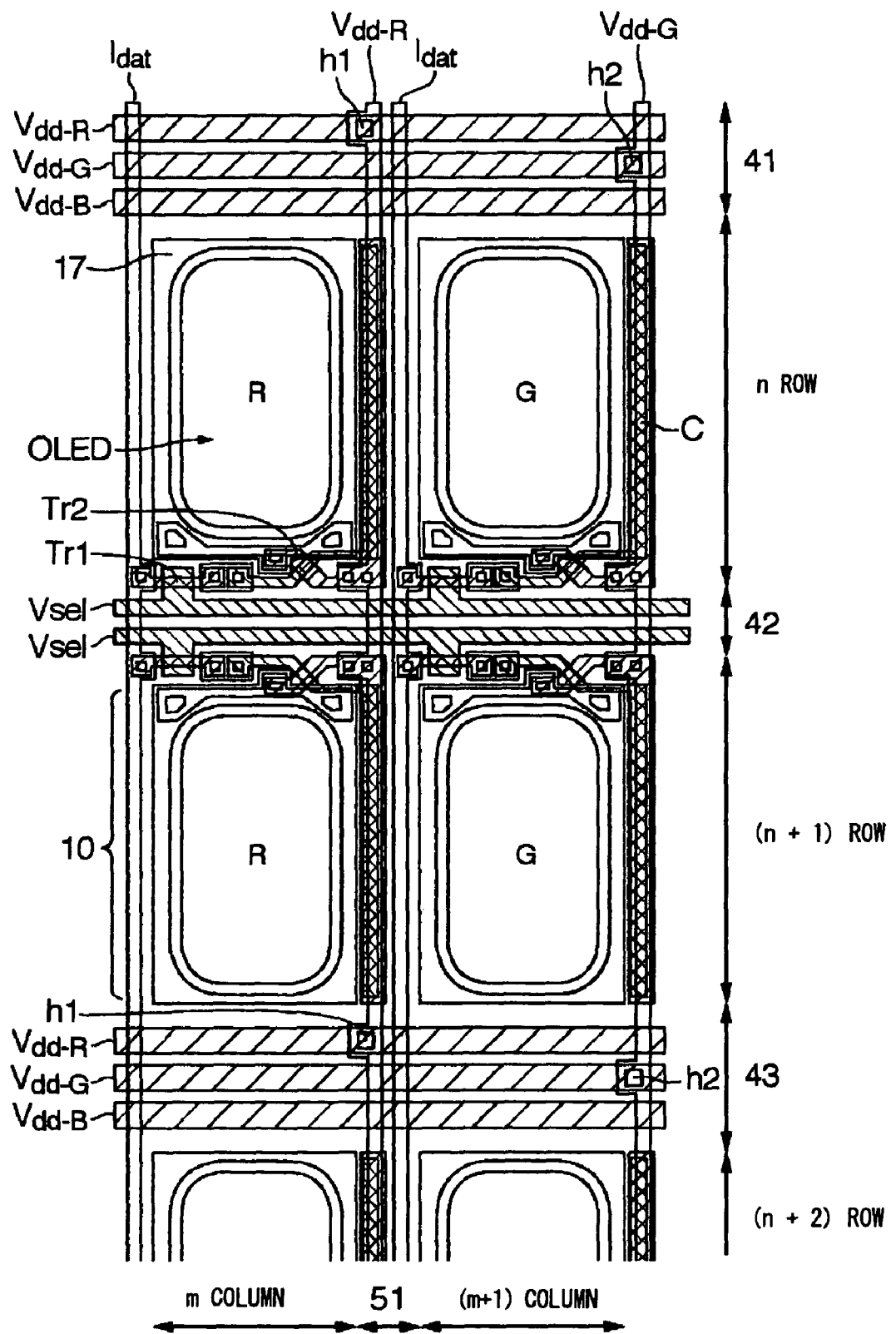
FIG. 4 is an explanatory diagram for describing a wiring layout according to a second embodiment.

FIG. 4 is an explanatory diagram for describing a wiring layout according to a second embodiment of the present invention.

The present embodiment has a configuration wherein, in the event that an imaginary layout diagram sheet, determining the layout of the line forming regions formed along the row direction of the pixels, is folded with any line forming region of the multiple line forming regions as the center line, the line forming regions having the same configuration of the lines are overlaid on each other. The three electric power lines $V_{dd-G}$, $V_{dd-R}$, and $V_{dd-B}$ make up a combination, and are disposed in the row direction on a line forming region 41 between the pixel group of the (n−1) row and the pixel group of the n row, which are arrayed in the row direction, and the two scan lines $V_{sel}$ make up a combination, and are disposed in the row direction in a line forming region 42 between the pixel groups of the n row and the (n+1) row, which are arrayed in the row direction. The basic pattern of the wiring layout in the row direction has a configuration wherein the combination of the electric power lines $V_{dd-G}$, $V_{dd-R}$, and $V_{dd-B}$, and the combination of the two scan lines $V_{sel}$ are disposed periodically and repeatedly. Accordingly, a line forming region 43 between the pixel groups of the (n+1) row and the (n+2) row, which are arrayed in the row direction, has the same wiring layout as with the line forming region 41.

On the other hand, one electric power line $V_{dd}$ and one data line $I_{dat}$ make up a combination, and are disposed in the column direction and are disposed on a line forming region between pixel groups arranged in the column direction. With an arrangement shown in the drawing, the electric power line $V_{dd-R}$ and the data line $I_{dat}$ make up a combination, and are disposed on a line forming region 51 between the R-pixel group of the m column and the G-pixel group of the (m+1) column, which are arrayed in the column direction. In the same way, the electric power line $V_{dd-G}$ and the data line $I_{dat}$ make up a combination, and are disposed on a line forming region between the G-pixel group of the (m+1) column and the B-pixel group (not shown) of the (m+2) column, which are arrayed in the column direction, wherein only the electric power line $V_{dd-G}$ is shown in the drawing for convenience of description. Furthermore, the electric power lines $V_{dd-R}$ disposed in the row and column directions are formed in different layers, and are electrically connected with each other through contact holes h1 formed in an inter-layer insulating film. The electric power lines $V_{dd-G}$ are electrically connected with each other through contact holes h2 in the same way.

With the present embodiment, the same kind of electric power line extending in the row direction of the pixel matrix is formed in the column direction with generally the same array pitch, and accordingly, the present embodiment has the same advantages as with the first embodiment, and furthermore, the electric power lines $V_{dd-G}$, $V_{dd}$ R, and $V_{dd-B}$ are disposed on a pixel region in the row direction and the column direction in the form of a matrix, and accordingly, the wiring resistance of the electric power lines $V_{dd-G}$, $V_{dd-R}$, and $V_{dd-B}$ can be reduced, thereby enabling sufficient current supply to the organic EL devices. Accordingly, occurrence of non-uniformity of luminance due to insufficient current supply to a particular electric power line can be suppressed, and furthermore, cross-talk can be reduced. In particular, a large-screen display requires sufficient and uniform current over the screen thereof, and accordingly, the present embodiment is particularly advantageous.

Third Embodiment

Figure 5:
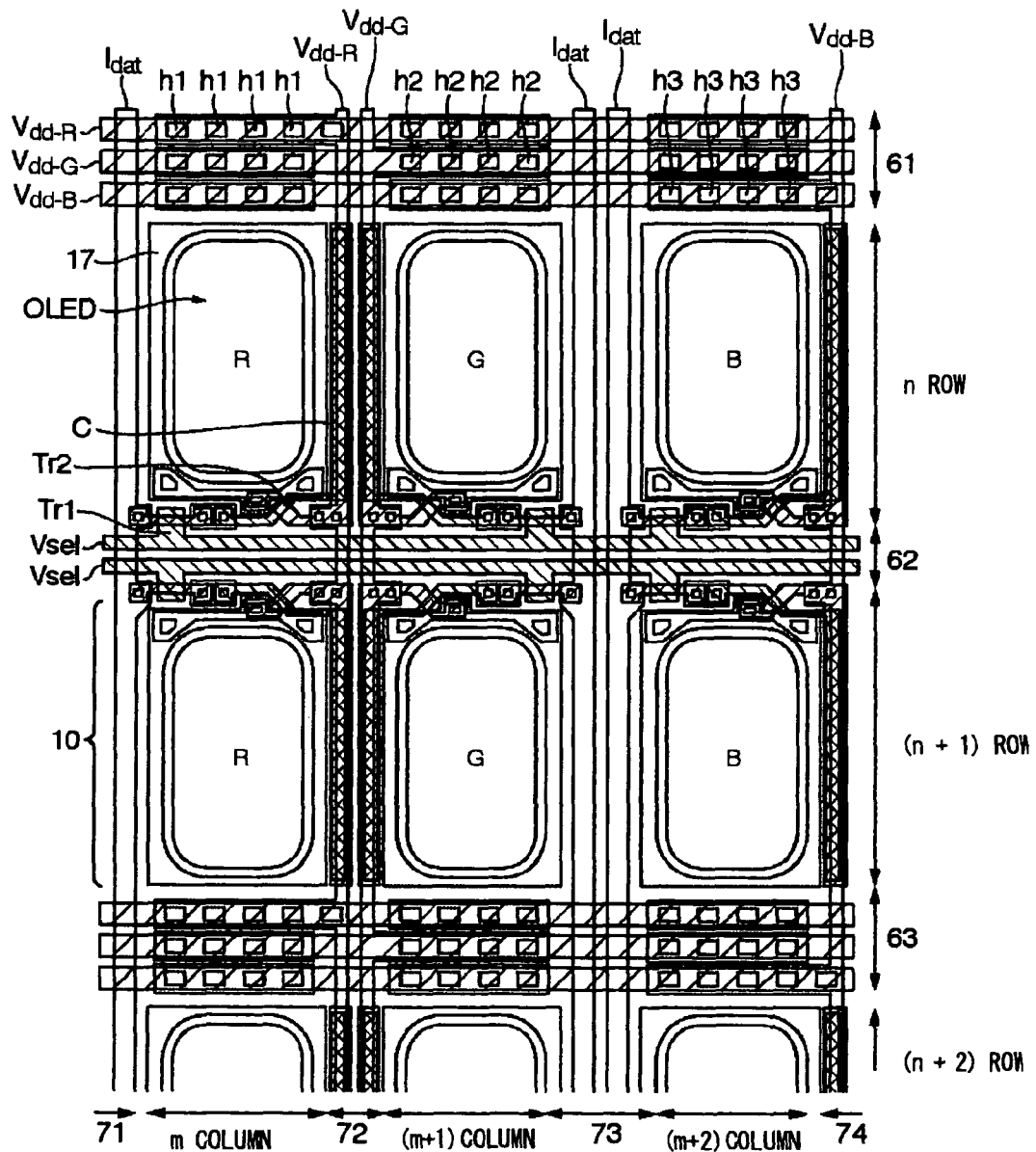
FIG. 5 is an explanatory diagram for describing a wiring layout according to a third embodiment.

FIG. 5 is an explanatory diagram for describing a wiring layout according to a third embodiment of the present invention.

The present embodiment has a configuration wherein, in the event that an imaginary layout diagram sheet, determining the layout of the line forming regions formed along the row direction and the column direction of the pixels, is folded with any line forming region of the multiple line forming regions as the center line, the line forming regions having the same configuration of the lines are overlaid on each other. The three electric power lines $V_{dd-G}$, $V_{dd-R}$, and $V_{dd-B}$ make up a combination, and are disposed in the row direction on a line forming region 61 between the pixel group (not shown) of the (n−1) row and the pixel group of the n row, which are arrayed in the row direction, and the two scan lines $V_{sel}$ make up a combination, and are disposed in the row direction in a line forming region 62 between the pixel groups of the n row and the (n+1) row, which are arrayed in the row direction. The basic pattern of the wiring layout in the row direction has a configuration wherein the combination of the three electric power lines $V_{dd-G}$, $V_{dd-R}$, and $V_{dd-B}$, and the combination of the two scan lines $V_{sel}$ are disposed periodically and repeatedly. Accordingly, a line forming region 63 between the pixel groups of the (n+1) row and the (n+2) row, which are arrayed in the row direction, has the same wiring layout as with the line forming region 61.

On the other hand, three combinations of two lines selected from the three electric power lines $V_{dd-C}$, $V_{dd-R}$, and $V_{dd-B}$, and the three data lines $I_{dat}$ are formed between the pixel groups arrayed in the column direction. With an arrangement shown in the drawing, the electric power line (not shown) and the data line $I_{dat}$ make up a combination, and are disposed in a line forming region 71 between the B-pixel group (not shown) of the (m−1) column and the R-pixel group of the m column, which are arrayed in the column direction, and the two electric power lines $V_{dd-G}$ and $V_{dd-R}$ make up a combination, and are disposed on a line forming region 72 between the R-pixel group of the m column and the G-pixel group of the (m+1) column, which are arrayed in the column direction. Furthermore, the two data lines $I_{dat}$ make up a combination, and are disposed on a line forming region 73 between the G-pixel group of the (m+1) column and the B-pixel group of (m+2) column, which are arrayed in the column direction, and the electric power line $V_{dd-G}$ and the data line $I_{dat}$ make up a combination, and are formed on a line forming region 74 between the B-pixel group of the (m+2) column and the R-pixel group (not shown) of the (m+3) column, which are arrayed in the column direction.

The electric power lines disposed in the column and row directions are formed in different layers, and are electrically connected with each other through the contact holes h1 formed on an inter-layer insulating film. In the same way, the electric power lines $V_{dd-G}$ in the column and row directions, and the electric power lines $V_{dd-B}$ in the column and row directions, are formed in different layers, and the electric power lines in the column and row directions are electrically connected with each other through the contact holes h2 and h3. With the present embodiment, a plurality of each of the contact holes h1, h2, and h3 are formed, whereby the present embodiment has the advantage of preventing wiring breakage, and furthermore has the advantage of reducing the wiring resistance.

With the present embodiment, the same kind of electric power line extending in the row direction of the pixel matrix is formed in the column direction with generally the same array pitch, the same kind of electric power line extending in the column direction of the pixel matrix is formed in the row direction with generally the same array pitch, and accordingly, the present embodiment has the same advantages as with the first embodiment, and furthermore, the electric power lines $V_{dd-G}$, $V_{dd-R}$, and $V_{dd-B}$ are disposed on a pixel region in the row direction and the column direction in the form of a matrix, and accordingly, the wiring resistance of the electric power lines $V_{dd-G}$, $V_{dd-R}$, and $V_{dd-B}$ can be reduced, thereby enabling sufficient current supply to the organic EL devices. Accordingly, occurrence of non-uniformity of luminance due to insufficient current supply to a particular electric power line can be suppressed, and furthermore, the occurrence of cross-talk can be reduced. In particular, a large-screen display requires sufficient and uniform current over the screen thereof, and accordingly, the present embodiment is particularly advantageous.

Fourth Embodiment

Figure 6A:
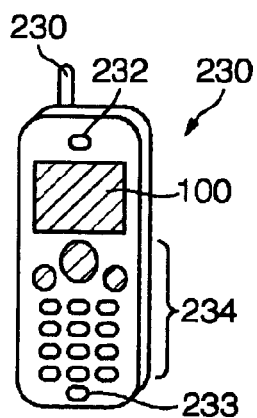
FIG. 6(*a*) through FIG. 6(*f*) are explanatory diagrams for describing application examples employing the organic EL display according to the present invention.
Figure 6B:
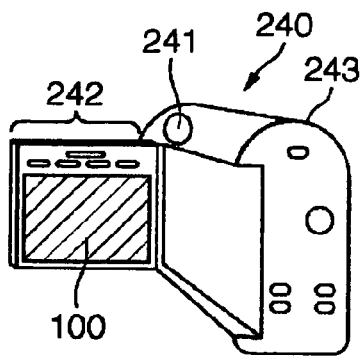
Figure 6C:
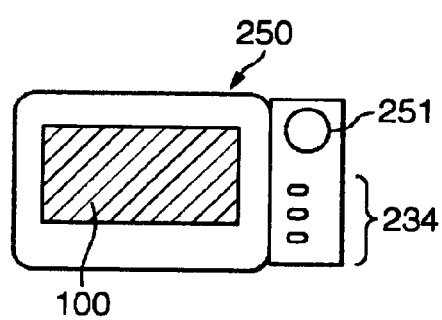

FIG. 6(a) through FIG. 6(f) are diagrams which illustrate examples of electronic apparatuses to which the electric-optical device according to the present invention can be applied. FIG. 6(a) shows an example of application to a cellular phone, wherein the cellular phone 230 comprises an antenna unit 231, an audio output unit 232, an audio input unit 233, an operating unit 234, and the organic EL display panel 100 according to the present invention. As described above, the organic EL display panel 100 according to the present invention can be employed as a display unit of the cellular phone 230. FIG. 6(b) shows an application example to a video camera, wherein the video camera 240 comprises a TV-camera unit 241, an operating unit 242, an audio input unit 243, and the organic EL display panel 100 according to the present invention. As described above, the organic EL display panel 100 can be employed as a viewfinder or a display unit. FIG. 6(c) shows an application example to a portable personal computer, wherein the computer 250 comprises a camera unit 251, an operation unit 252, and the organic EL display panel 100 according to the present invention. As described above, the organic EL display panel 100 can be employed as a display device.

Figure 6D:
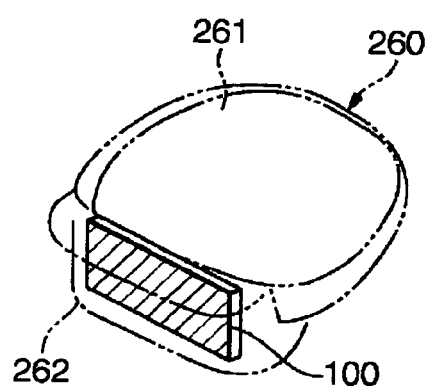
Figure 6E:
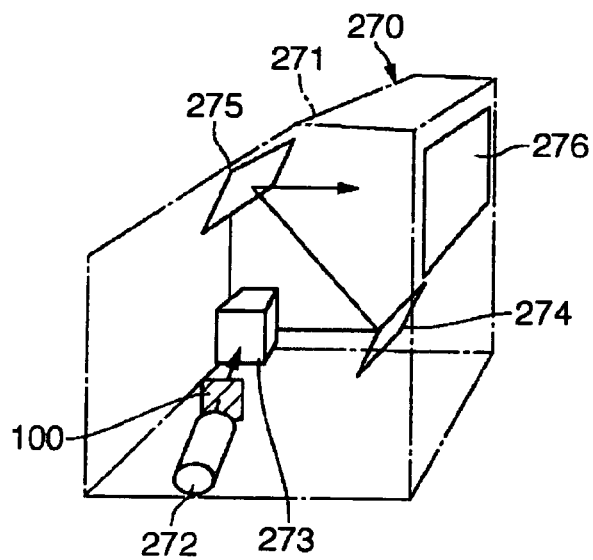
Figure 6F:
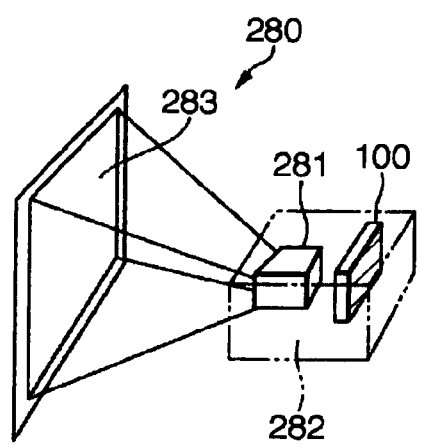

FIG. 6(d) shows an application example to a head mount display, wherein the head mount display 260 comprises a belt 261, an optical system storage unit 262, and the organic EL display panel 100 according to the present invention. As described above, the organic EL display panel 100 can be employed as an image display unit. FIG. 6(e) shows an application example to a rear projector, wherein the projector 270 comprises a casing 271, a light source 272, a synthesizing optical system 273, mirrors 274 and 275, a screen 276, and the organic EL display panel 100 according to the present invention. FIG. 6(f) shows an application example to a front projector, wherein the projector 280 comprises a casing 282, an optical system 281, and the organic EL display panel 100 according to the present invention, wherein an image can be displayed on a screen 283. As described above, the organic EL display panel 100 can be employed as an image display unit.

Figure 7:
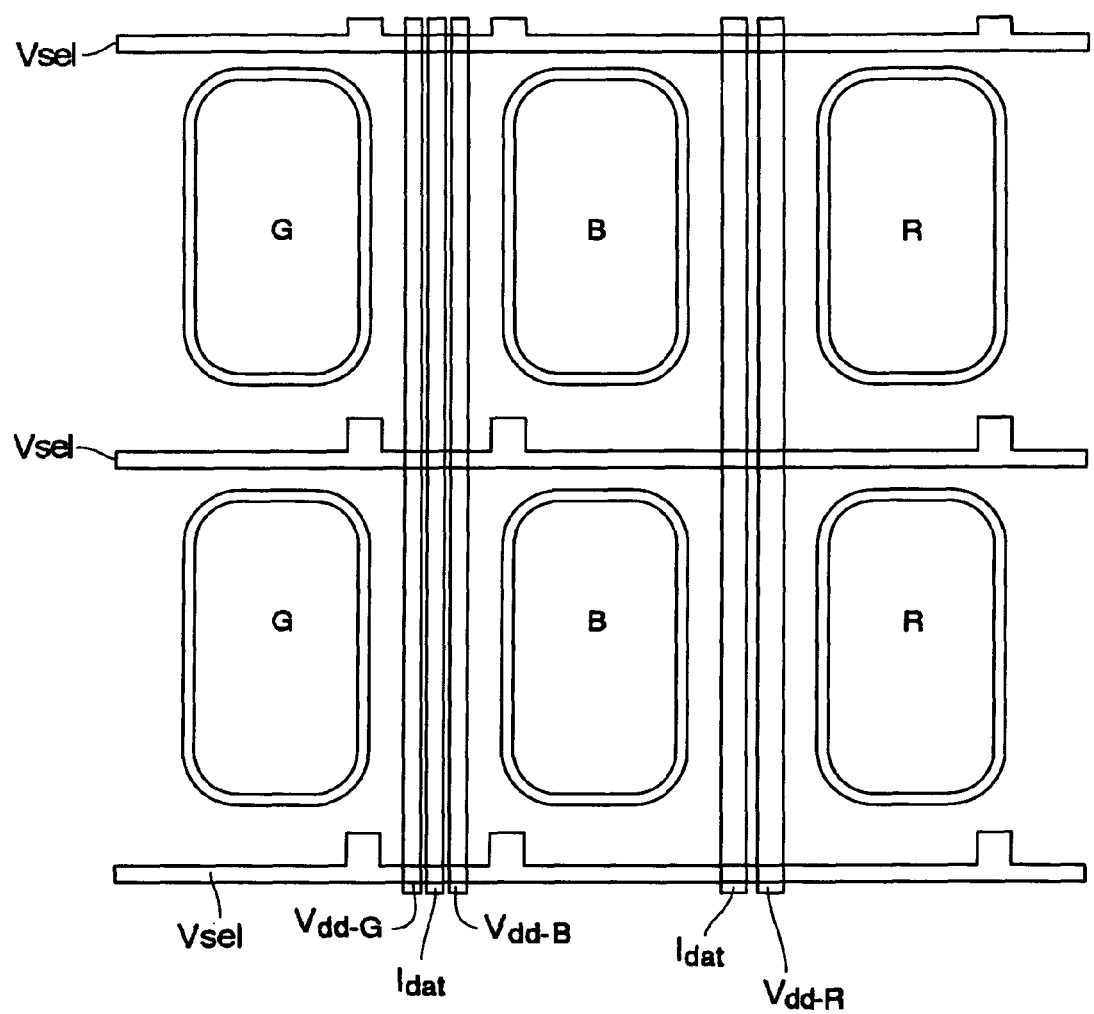
FIG. 7 is an explanatory diagram for describing a wiring layout according to a fourth embodiment.

FIG. 7 is an explanatory diagram for describing a wiring layout according to another embodiment. Specifically, combinations of lines selected from the three electric power lines $V_{dd-G}$, $V_{dd-R}$, and $V_{dd-B}$, and the data lines $I_{dat}$ are formed between the pixel groups arrayed in the column direction. In addition, scan lines $V_{sel}$ are formed between pixel groups arrayed in the row direction.

Figure 8:
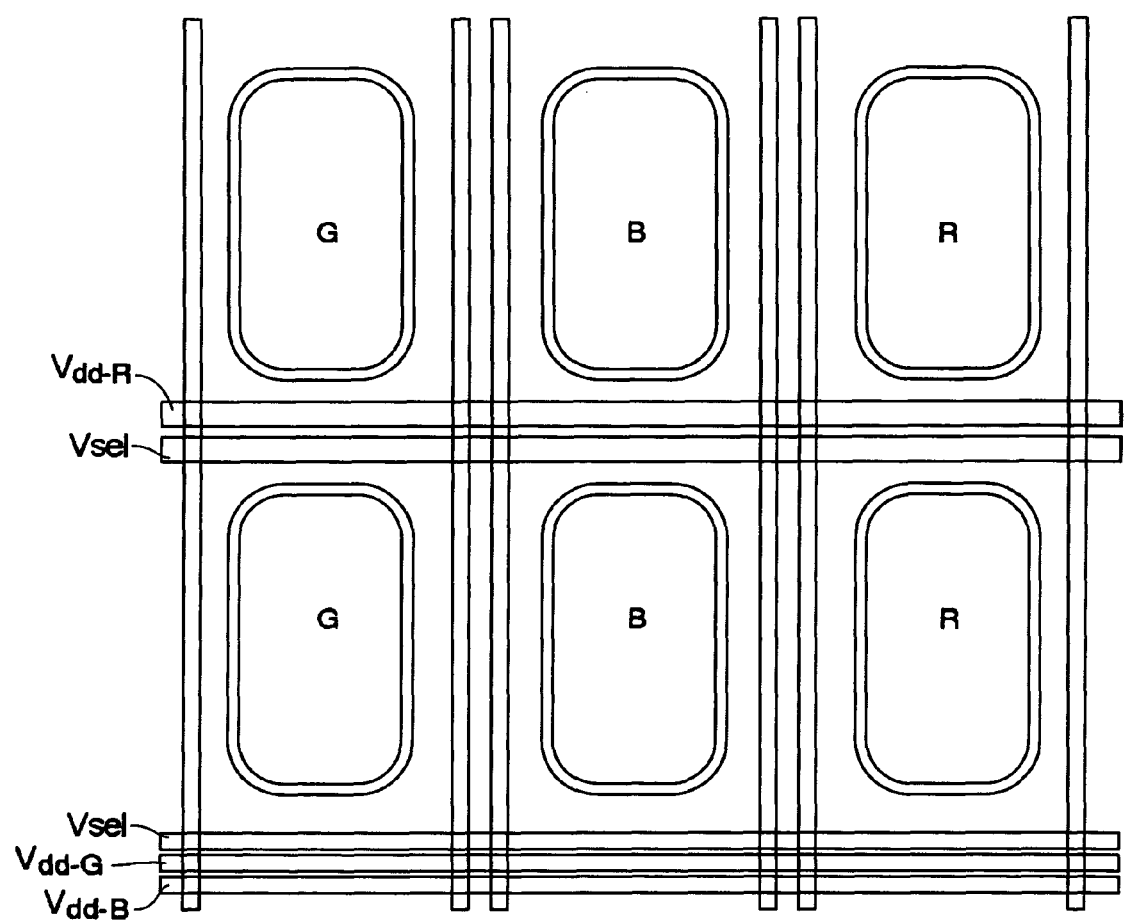
FIG. 8 is an explanatory diagram for describing a wiring layout according to a fifth embodiment.

FIG. 8 is an explanatory diagram for describing a wiring layout according to another embodiment. Specifically, combinations of lines selected from the three electric power lines $V_{dd-G}$, $V_{dd-R}$, and $V_{dd-B}$, and the scan lines $V_{sel}$ are formed between pixel groups arrayed in the row direction.

What is claimed is:

1. An electro-optical device comprising:
   a scan line;
   a data line that intersects the scan line;
   a first electrode;
   a second electrode;
   a light emission layer that is disposed between the first electrode and the second electrode;
   a first power line that has a first portion extending in a first direction and a second portion extending in a second direction that intersects the first direction;
   a second power line that extends in the second direction, the second power line overlapping at least a part of the second portion of the first power line; and
   an inter-layer insulating film that is disposed between the first power line and the second power line,
   the second portion of the first power line being electrically connected to the second power line through plurality of contact holes.

2. The electro-optical device according to claim 1, the second portion of the first power line extending from the first portion along the second direction to only one side,
   the second portion being positioned on one side of the first portion of the first power line with respect to the first portion of the first power line, and
   the second portion not being positioned on the other side with respect to the first portion of the first power line.

3. The electro-optical device according to claim 1, the second power line being electrically connected to the first electrode.

4. The electro-optical device according to claim 1, the plurality of contact holes extending along the first direction.

5. An electro-optical device comprising:
   a plurality of scan lines;
   a plurality of data lines that intersect the plurality of scan lines;
   a plurality of pixels that is disposed corresponding to a plurality of intersections of the plurality of scan lines and the data lines, each of the plurality of pixels including a first pixel and a second pixel, each of the first pixel and the second pixel having a light emission layer between a first electrode and a second electrode, the first pixel and the second pixel being aligned along a first direction along which the plurality of scan lines extend;
   a first power line that extends along the first direction;
   a second power line that extends along a second direction that intersects the first direction; and
   a third power line that extends along the second direction,
   the first power line being electrically connected to the second power line at a first connecting portion, the first connecting portion being located in the first pixel,
   the first power line being electrically connected to the third power line at a second connecting portion, and
   the second connecting portion being located in the second pixel.

6. The electro-optical device according to claim 5, the first power line being electrically connected to the first pixel and the second pixel.

7. The electro-optical device according to claim 5, the second power line being electrically connected to the first electrode.

* * * * *